(12) United States Patent
Thao et al.

(10) Patent No.: US 9,516,783 B2
(45) Date of Patent: Dec. 6, 2016

(54) THERMOELECTRIC COOLER CONTROLLER

(71) Applicant: Hoffman Enclosures, Inc., Anoka, MN (US)

(72) Inventors: Shawn Adam Thao, Vadnais Heights, MN (US); Jason Dickmann, Champlin, MN (US); Victor Divine, Forest Lake, MN (US)

(73) Assignee: Hoffman Enclosures, Inc., Anoka, MN (US)

( * ) Notice: Subject to any disclaimer, the term of this patent is extended or adjusted under 35 U.S.C. 154(b) by 100 days.

(21) Appl. No.: 14/555,173

(22) Filed: Nov. 26, 2014

(65) Prior Publication Data

US 2016/0150677 A1     May 26, 2016

(51) Int. Cl.
*H05K 7/20* (2006.01)

(52) U.S. Cl.
CPC .................. *H05K 7/20136* (2013.01)

(58) Field of Classification Search
CPC ............. G06F 1/20; G06F 1/203; G06F 1/206
USPC ............ 361/689, 690, 694, 695; 62/3.2, 3.6, 62/259.2
See application file for complete search history.

(56) References Cited

U.S. PATENT DOCUMENTS

| | | | |
|---|---|---|---|
| 5,450,727 A | 9/1995 | Ramirez et al. | |
| 5,704,212 A * | 1/1998 | Erler | F25B 21/04 361/679.41 |
| 6,205,790 B1 | 3/2001 | Denkin et al. | |
| 6,220,043 B1 | 4/2001 | Chaney et al. | |
| 6,462,520 B1 | 10/2002 | Mangtani et al. | |
| 6,725,682 B2 * | 4/2004 | Scott | G06F 1/20 165/80.3 |
| 6,746,274 B1 | 6/2004 | Verfuerth | |
| 6,857,276 B2 | 2/2005 | Finn et al. | |
| 7,174,738 B2 * | 2/2007 | Scott | F28F 3/12 165/80.4 |
| 7,185,500 B2 * | 3/2007 | Meir | G06F 1/20 257/E23.08 |
| 7,290,395 B2 | 11/2007 | Deal | |
| 7,325,406 B2 * | 2/2008 | Lee | G06F 1/20 165/104.33 |

(Continued)

OTHER PUBLICATIONS

Thermoelectric Temperature Controller Instruction Manual; 12 pgs; Rev. D © 2013 Pentair Equipment Protection.

*Primary Examiner* — Anthony Haughton
(74) *Attorney, Agent, or Firm* — Quarles & Brady LLP (57) ABSTRACT

A thermal management system for an enclosure containing electrical components includes a thermoelectric cooling unit for controlling temperature inside the enclosure and a controller for the cooling unit, the controller being configured so that it can be installed within and protected by the enclosure, rather than requiring its own separate secure enclosure. The controller includes a simplified power management circuit that uses an input quick connector that receives a first cable connector for providing power to the circuit board, and an output quick connector that receives a second cable connector for supplying power from the input quick connector to the fan of the cooling unit. This one-in, one-out arrangement allows for the elimination of multiple hard-wired cable harnesses and the corresponding connectors on the circuit boards of existing controllers. The circuit board size is reduced, and terminal blocks eliminated, so that the controller can be installed inside the enclosure.

11 Claims, 5 Drawing Sheets

(56) References Cited

U.S. PATENT DOCUMENTS

| | | |
|---|---|---|
| 7,975,492 B2 | 7/2011 | Alahyari |
| 8,051,665 B2 | 11/2011 | Lipkin et al. |
| 8,684,534 B2 | 4/2014 | Lin et al. |
| 2003/0110779 A1* | 6/2003 | Otey ................. F25B 21/02 62/3.2 |
| 2006/0277923 A1* | 12/2006 | Lee ................... F25B 21/02 62/3.2 |
| 2010/0281884 A1 | 11/2010 | Rawski et al. |

\* cited by examiner

THERMOELECTRIC COOLER CONTROLLER

RELATED APPLICATIONS

Not Applicable

BACKGROUND

Thermal management systems are often used to provide cooling to electronic and electrical components, such as in manufacturing controls, telecom equipment, data networks, and/or other vital systems to optimize operating conditions of the electronic and electrical components. A typical thermal management system for cooling a main enclosure may include one or more cooling units, a controller, and a controller enclosure.

The main enclosure contains the electrical and electronic components that are to be cooled, and may be fireproof, which requires precise, low-tolerance design to protect the components. The cooling unit(s) are mounted within the main enclosure and may include a fan and a heat sink for removing heat from the main enclosure. The controller generally provides commands to the cooling units through an electrical signal, while power for the cooling units is provided for using a separate power source. In some applications the controller may be used to power and control the cooling modules. In this situation, the wires bringing power into the controller and the wires taking power out of the controller and into the cooling units are hard wired to the controller. Typically, the cooling modules are electrically connected to a terminal block of the controller. This may make installation more complicated, makes it more difficult to swap out a first controller for a second controller, and makes relocating the thermal management system more difficult.

Figure 1:
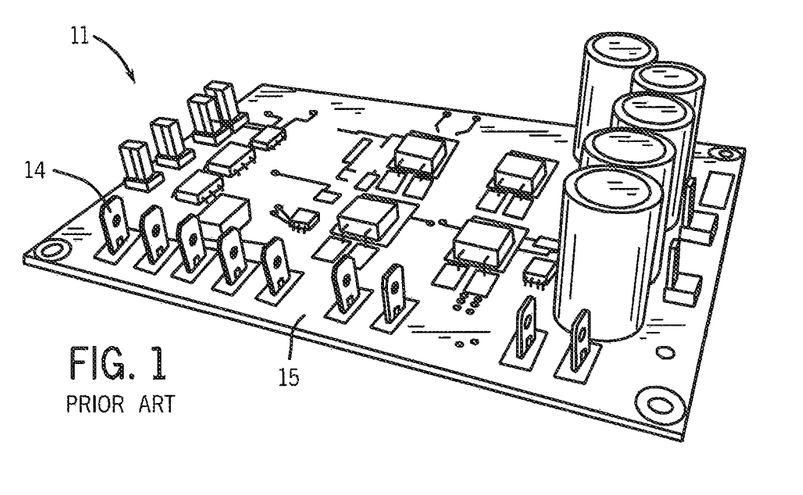
FIG. 1 is a perspective view of a prior art controller for a thermoelectric cooling unit.

Due to the size of the controller and the limited availability of space in the main enclosure, the controller is mounted outside of the main enclosure. In order to provide the necessary hardwire connection and, in fireproof or otherwise secure application, to enclose and protect the controller, a controller enclosure, as shown in FIG. 1, is needed. The controller enclosure may be attached to an outside surface of the main enclosure or may be attached to a surface external to the main enclosure, such as a nearby wall. This results in more material being used to build a second enclosure, more space being used up overall by the thermal management system, and more complexity in installation the thermal management system.

Accordingly, it would be useful to provide a controller that takes up less space, that does not require its own separate enclosure, and that provides for a simpler connection between an input on the controller and an output on the controller to simplify installation and modification of the thermal management system.

SUMMARY

In one embodiment, the present disclosure provides a thermal management system for an enclosure containing electrical components. The thermal management system includes a thermoelectric cooling unit mounted on the enclosure such that the cooling unit cools an interior space of the enclosure. The cooling unit has a fan for driving air into the interior space. The thermal management system further includes a controller located within the housing in electrical communication with the cooling unit and configured to operate one or more components of the cooling unit. The controller includes a circuit board, an input quick connector disposed on the circuit board and configured to receive a first cable connector for providing power to the circuit board, and an output quick connector disposed on the circuit board in electrical communication with the input quick connector and configured to receive a second cable connector for supplying power from the input quick connector to the fan of the cooling unit. The controller can be mounted to the cooling unit, in which case the cooling unit can include a heat sink and the controller can be mounted on a mounting plate which is in turn mounted to a portion of the heat sink. The controller can be less than three inches wide.

The controller and the cooling unit can both be mounted to an interior surface of the enclosure. The input quick connector can be a five pin connector, and can provide to the circuit board a positive voltage, a negative voltage, a common ground, a normal open, and a normal close. The output quick connector can be a four pin connector, and can supply from the controller a positive fan voltage, a negative fan voltage, a negative H-bridge signal, and a positive H-bridge signal. The circuit board can include a thermistor connector. The circuit board can have exactly three electrical cable connectors: the input quick connector, the output quick connector, and the thermistor connector.

In another embodiment, the present disclosure provides a controller for a thermal management unit. The controller includes a circuit board mountable to the thermal management unit or within a main enclosure managed by the thermal management unit such that the controller is enclosed within the main enclosure. The controller further includes a first quick disconnect connector disposed on the circuit board and configured to receive a first cable connector for providing power to the circuit board, and a second quick disconnect connector disposed on the circuit board and configured to receive a second cable connector for supplying power to a device controlled by the controller. The first quick disconnect connector can be a five pin connector, and can provide to the controller a positive voltage, a negative voltage, a common ground, a normal open, and a normal close. The second quick disconnect connector can be a four pin connector, and can provide from the controller a positive H-bridge signal, a negative H-bridge signal, a positive fan voltage, and a negative fan voltage.

The device controlled by the controller can be a fan of the thermal management unit. The controller can be mounted to the thermal management unit. The thermal management unit can have a heat sink and a mounting plate, and the controller can be mounted to the mounting plate and the mounting plate can be mounted to a portion of the heat sink.

DETAILED DESCRIPTION

The present inventive controller overcomes the drawbacks of prior controllers through improvement of control circuits and application of circuit and electrical components that have not be previously applied in the described manner. As a result of the improvements, the inventive controller can have a significantly reduced form factor and simplified power connection and management, allowing the present controller to be mounted directly to the thermoelectric cooler (TEC) it is controlling or otherwise within the main enclosure. An example TEC that benefits from the present invention is the line of TB coolers by Pentair Equipment Protection, sold under the HOFFMAN brand name (e.g., TE09, TE12, TE16 products). Many other products satisfying industry standards for thermoelectric units, particularly compact, low-profile, Peltier effect heating or cooling thermoelectric units for small enclosures (collectively "TECs" herein). The TECs and controllers are described herein primarily as "cooling" units, but it will be understood that, unless otherwise indicated, the TECs and controllers can be configured to provide temperature control in the form of cooled or heated air delivered to the interior of the enclosure.

Figure 2:
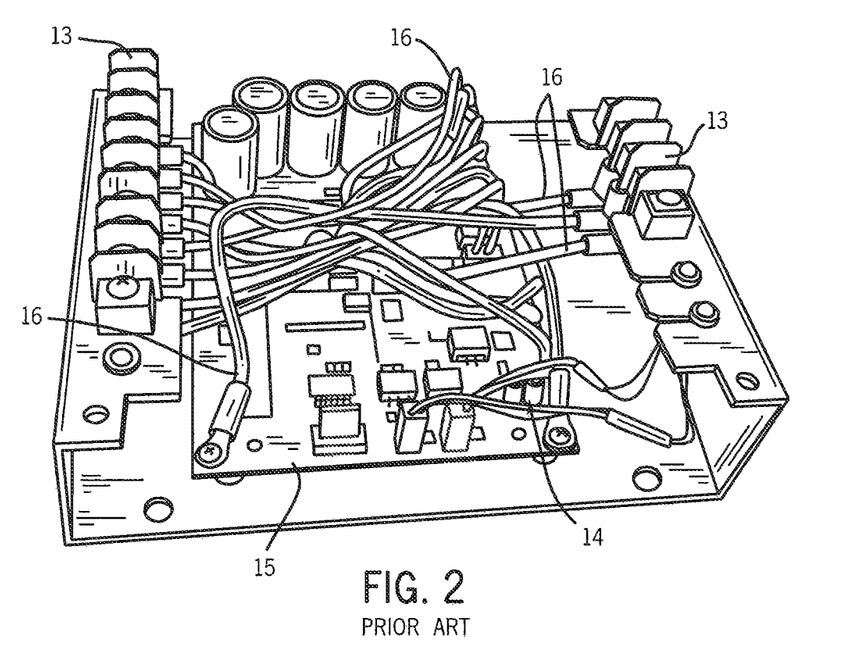
FIG. 2 is a perspective view of the controller of FIG. 1 in a controller enclosure from the prior art.
Figure 3:
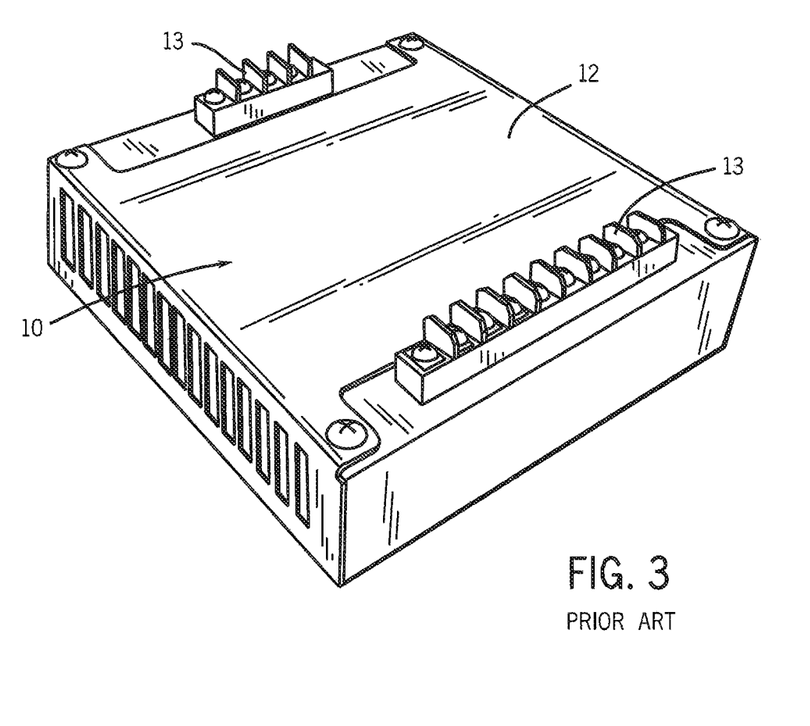
FIG. 3 is a perspective view of the closed controller enclosure of FIG. 2.

For comparison purposes, FIGS. 1-3 illustrate an exemplary prior thermoelectric cooler (TEC) control module 10, which includes the TEC controller 11 installed within its own housing 12. The TEC controller 11 is designed to be hardwired to the terminal blocks 13 of the housing 12, thus requiring a plurality of wiring harness connectors 14 on the board 15 of the TEC controller 11. Correspondingly, the board 15 must have sufficient area to accommodate the connectors 14. The illustrated board 15 has dimensions of 3.85 in×5.25 in, which is typical of prior TEC controllers. Furthermore, each connector 14 is connected to a terminal of the terminal blocks 13 via a separate wiring harness 16, adding complexity, parts, and assembly time to the module 10.

Figure 4:
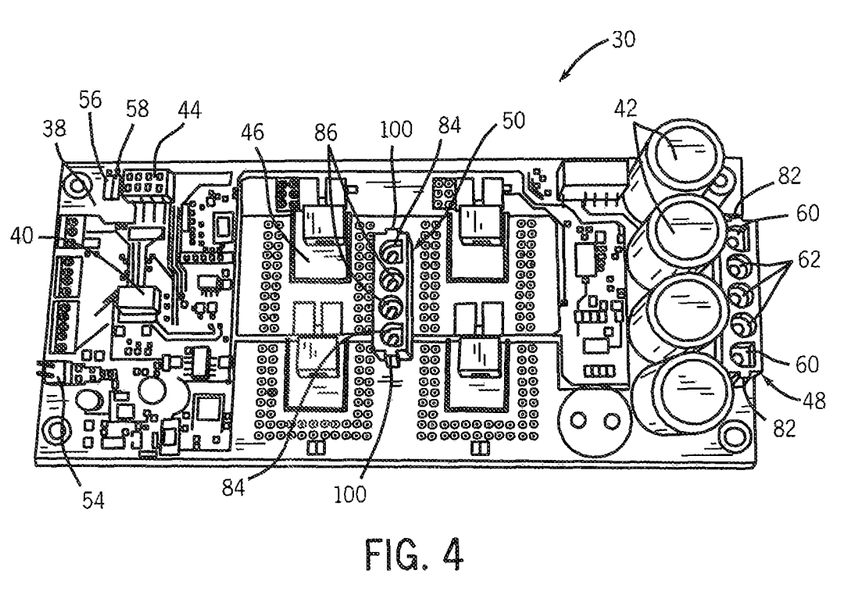
FIG. 4 is a top perspective view of controller in accordance with the present disclosure.

Referring to FIG. 4, a TEC controller 30 in accordance with the disclosed invention may contain a circuit board 38, a microcontroller 40, a plurality of electrolytic capacitors 42, such as four electrolytic capacitors 42, a four position dip switch 44, a MOSFET H-bridge 46, a female input quick connector 48, a female output quick connector 50, and a thermistor connector 54. Using the layout of circuit paths and components described below, the controller 30 may achieve a circuit board 38 size that is small enough to fit inside the main enclosure typically managed by a TEC. The dimensions of the controller 30 are such that the controller 30 further does not interfere with air flow within the enclosure and does not require increasing the enclosure size beyond that which would be served by a system with a controller external to the enclosure (e.g., prior art TEC controller 11 of FIGS. 1-3). In particular, the circuit board 38 of the illustrated TEC controller 30 may measure less than three inches wide, and particularly approximately 2.875 inches wide and 6.320 inches long. The input and output quick connectors 48, 50, and optionally the thermistor connector 54, may be the only electrical cable connectors on the board 15, thus efficiently providing a one-in, one-out quick-connect power connection for both the controller 30 and the TEC fan or other powered components of the TEC. The board 15 size may be reduced upon eliminating the extra cable connectors (e.g., wiring harness connectors 14) of existing controllers 11. The controller 30 may further include a set of indicators, such as a first color (e.g., red) LED 56 and a second color (e.g., blue) LED 58, which may be mounted directly on the controller 30 to eliminate wiring harnesses therefor.

The female input quick connector 48 may be a rectangular female connector having five pin receiving holes. The pin receiving holes are preferably arranged in a line to minimize the space taken on the circuit board 38 with respect to other components, described below. The two outer pin holes can be keyed pin receiving holes 60, such as with a square having one arched side, with the two keyed pin receiving holes 60 having an arch on the same side, and the three inner pin holes may all be circular pin receiving holes 62. The keyed holes 60 may require that a male input quick connector attached to an input harness may be attached to the female input quick connector 48 in only one orientation. The pin receiving holes 60 and 62 may, for example, be configured to receive an input current from a power supply. In an example configuration, the pin receiving holes 60, 62 include a negative voltage inlet, a positive voltage inlet, a normal open inlet, a common ground inlet, and a normal close inlet. In some embodiments, the female input connector 48 may be configured as a five-circuit Universal MATE-N-LOK connector produced by Tyco Electronics. The female input quick connector 48 may couple to an input harness (e.g., input harness 68 of FIG. 5) having a male input quick connector (not shown) with the same number of pin holes as the female input quick connector 48 and similarly keyed. The male input quick connector (not shown) may attach in a detachable manner to a pair of protrusions 82 extending from opposite sides of the female input quick connector 48, and adjacent to the keyed pin receiving holes 60, to quickly and securely attach the input harness to the controller 30.

The female output quick connector 50 may be, for example, a J2 type rectangular female connector having four pin holes in a line. Like the female input quick connector 48, the female output quick connector 50 may have two outer keyed pin receiving holes 84 and two circular pin receiving holes 86, such that a male output quick connector may attach to the female output quick connector 50 in only one orientation. The pin receiving holes 84 and 86 may be configured to supply a current, via circuit paths of the controller 30, from the female input quick connector 48 to an attached output harness (e.g., output harness 96 of FIG. 5) that is in turn connected to a component of the TEC. In some embodiments, the female output connector 50 may be configured as a four-circuit Universal MATE-N-LOK connector produced by Tyco Electronics. The female output quick connector 50 may, for example, connect to a fan or other powered component of the TEC, and may provide a positive fan voltage output, a negative fan voltage output, a positive H-bridge output, and a negative H-bridge output. The positive H-bridge output and the negative H-bridge output may both connect to the H-bridge 46, while the positive fan voltage output and the negative fan voltage output may provide power from the power supply to the fan. In some embodiments, the positive H-bridge output may be used to provide heating to the TEC, while the negative H-bridge output may be used to provide cooling to the TEC; typically, either the positive or negative H-bridge is operating, while the other is idle.

Figure 5:
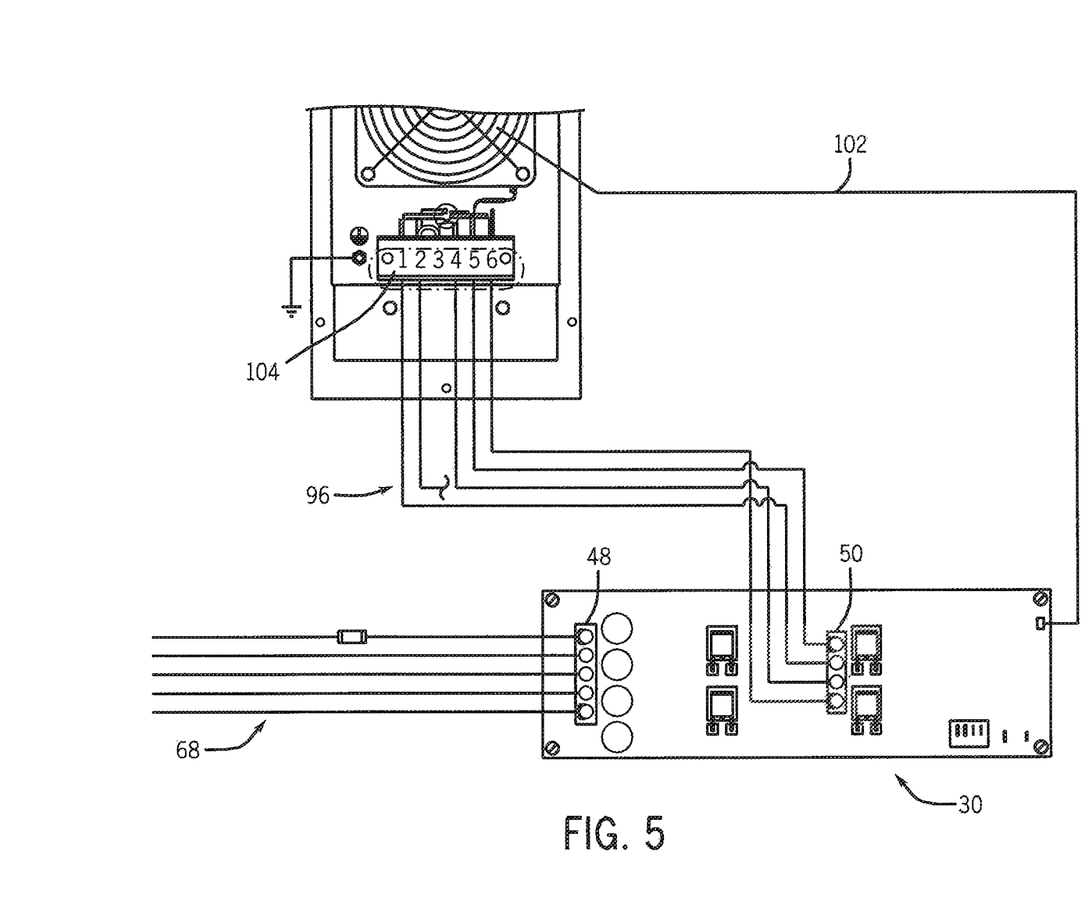
FIG. 5 is schematic view of a thermal management system using the controller of FIG. 4.

Referring to FIG. 5, an input harness 68 may attach the controller 30, via the female input quick connector 48, to a power source (not shown). The controller 30 may be able to receive either 24 VDC or 48 VDC being supplied through the input harness 68. An output harness 96 may attach the controller 30, via the female output quick connector 50, to a powered component of the TEC 26, such as a fan 24. The output harness 96 may attach to a terminal block 104 of the fan 24 and/or TEC 26.

A thermistor 102 may connect to the thermistor connector 54 of the controller 30. The free end of the thermistor 102 may be mounted or placed near a desired area within the enclosure to monitor the temperature in that location. The thermistor 102 may supply a temperature signal to the controller 30. The temperature signal may be used by the microcontroller 40 to automatically adjust the PWM signal. Furthermore, the temperature signal may be used by the microcontroller 40 to determine if the red 56 and blue 58 LEDs should be turned on to indicate to an operator the temperature status of the enclosure (i.e., if the thermal management system 20 is operating correctly). If the microcontroller 40 detects that the temperature is too high, then red LED 56 may be turned on. In contrast, if the temperature is too cold, then the blue LED 58 may be turned on. Similarly, the red 56 and blue 58 LEDs may be both turned on, or cycled on and off, during start up of the thermal management system 20 to indicate that the sensor is faulty, or that a start up test of the thermal management system 20 has been executed successfully. In addition to the LEDs 56 and 58, an audible alarm may be activated through the controller to indicate that the temperature measured by the thermistor 102 is too hot or too cold, or if the temperature signal is faulty.

The four-position dip switch 44 may have two switches dedicated to heating setpoints and two switches dedicated to cooling setpoints. Each setpoint may be used to set a target temperature for the cooling system to reach, or alternatively two setpoints may be selected to act as an upper and lower desired temperature. The two heating setpoints may represent two selectable target temperatures for the thermal management system to heat to, as measured by the thermistor 102. While the two cooling setpoints may represent to selectable target temperatures to cool to, as measured by the thermistor 102.

During operation of the thermal management system, the rotational speed of the fan 24 may be adjusted using pulse width modulation (PWM). The desired rotational speed of the fan 24 and the percentage of the PWM signal sent to the fan 24, may be determined using the thermistor 102 and the microcontroller 40 to determine the optimum fan speed to heat or cool the electronically and/or electronic components. The PWM signal may be smoothly ramped up or down using the microcontroller 40. The H-bridge 46, which in the illustrated embodiment comprises four MOSFET transistors, may be capable of providing an adjustable PWM signal, between 10% and 100%, to the fan 24 and/or cooling unit 26. By increasing the PWM signal the rotational speed of the fan 24 may be increased to move more air through the cooling unit 26. The PWM signal may be sent through the positive H-bridge output and through the negative H-bridge output, while power to the fan 24 may be sent through the positive fan voltage output and the negative fan voltage output.

Figure 6:
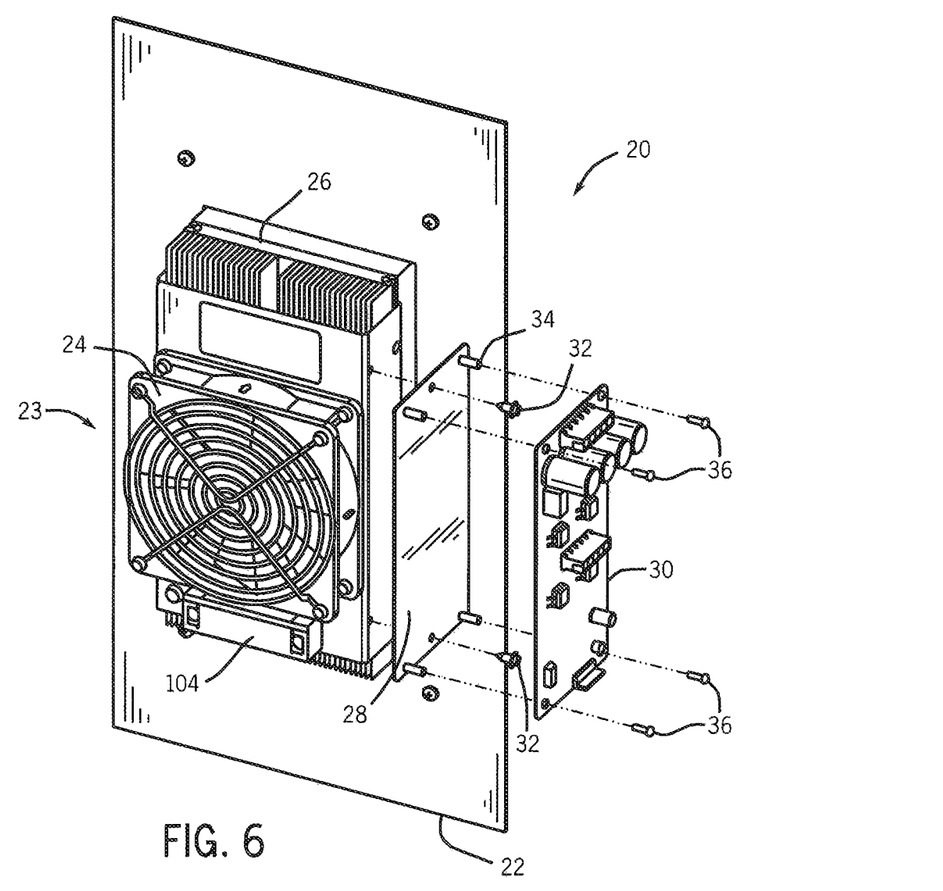
FIG. 6 is a perspective view of the controller of FIG. 4 being mounted to a thermoelectric cooling unit within a main enclosure.

Referring to FIG. 6, a partial interior perspective view of the thermal management system 20 is shown mounted through a wall panel 22 of a main enclosure. The enclosure may be a fire proof enclosure, and it and a wall panel 22 thereof may be made out of a fire proof material, such as metal, to prevent a fire from spreading into the enclosure from outside of the enclosure, or to prevent a fire escaping out of the enclosure from within the enclosure. The enclosure may be used to mount a plurality of electrical and/or electronic components and the thermal management system 20 for cooling the electrical and/or electronic components within the interior space of the enclosure.

The thermal management system 20 may include a cooling unit 23, a mounting plate 28, and a controller 30. The cooling unit 23 may have a fan 24 and a heat sink 26 and may be mounted to an interior surface of the enclosure 22, and may be used to transfer heat between the exterior and interior of the enclosure 22, such as through convection. Alternatively, or in addition to the cooling unit 23 may be attached over an inlet extending through the enclosure 22 to move heat between the enclosure 22 interior and exterior through convection. The fan 24 may be mounted to the heat sink 26 opposite the enclosure 22 to push or pull air through the cooling unit 23.

The mounting plate 28 may be mounted to a side portion of the cooling unit 23 using a plurality of fasteners 34, and may be located in an area that does not significantly impede the flow of air through the cooling unit 23. Alternatively, the mounting plate 28 may be mounted against an interior surface of the wall panel 22 in a location that does not significantly impede the flow of air through the enclosure and does not interfere with the placement of the electronic and/or electrical components within the enclosure. A plurality of spacers 34, such as four spacers 34, may be used to create a gap between the mounting plate 28 and the controller 30 to allow air to flow along the back side of the controller 30 and/or to electrically insulate the controller 30 from the cooling unit 23 and/or the wall panel 22. The controller 30 may be attached to the spacers 34 using a fastener 36 for each spacer 34.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein. Various features and advantages of the invention are set forth in the following claims.

The invention claimed is:

1. A thermal management system for enclosure containing electrical components, the thermal management system comprising:
 a thermoelectric cooling unit mounted on the enclosure such that the cooling unit cools an interior space of the enclosure, the cooling unit having a fan for driving air into the interior space; and
 a controller in electrical communication with the cooling unit and configured to operate one or more components of the cooling unit, the controller being located within the enclosure and comprising:
 a circuit board;
 an input quick connector disposed on the circuit board and configured to receive a first cable connector for providing power to the circuit board; and
 an output quick connector disposed on the circuit board in electrical communication with the input quick connector, and configured to receive a second cable connector for supplying power from the input quick connector to the fan of the cooling unit.

2. The thermal management system of claim 1, wherein the controller is mounted to the cooling unit.

3. The thermal management system of claim 2, wherein the cooling unit includes a heat sink, wherein the controller is mounted to a mounting plate, and wherein the mounting plate is mounted to a portion of the heat sink.

4. The thermal management system of claim 2, wherein the controller is less than three inches wide.

5. The thermal management system of claim 1, wherein the controller and the cooling unit are both mounted to an interior surface of the enclosure.

6. The thermal management system of claim 1, wherein the input quick connector is a five pin connector.

7. The thermal management system of claim 6, wherein the input quick connector provides to the circuit board a positive voltage, a negative voltage, a common ground, a normal open, and a normal close.

8. The thermal management system of claim 1, wherein the output quick connector is a four pin connector.

9. The thermal management system of claim 8, wherein the output quick connector supplies from the controller a positive fan voltage, a negative fan voltage, a negative H-bridge signal, and a positive H-bridge signal.

10. The thermal management system of claim 1, wherein the circuit board includes a thermistor connector.

11. The thermal management system of claim 10, wherein the circuit board has exactly three electrical cable connectors comprising the input quick connector, the output quick connector, and the thermistor connector.

* * * * *